United States Patent
Yuan

(10) Patent No.: US 11,943,882 B2
(45) Date of Patent: Mar. 26, 2024

(54) DISPLAY DEVICE AND DISPLAY METHOD

(71) Applicant: WUHAN CHINA STAR OPTOELECTRONICS TECHNOLOGY CO., LTD., Hubei (CN)

(72) Inventor: Peng Yuan, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 195 days.

(21) Appl. No.: 17/609,346

(22) PCT Filed: Sep. 13, 2021

(86) PCT No.: PCT/CN2021/117925
§ 371 (c)(1),
(2) Date: Nov. 5, 2021

(87) PCT Pub. No.: WO2023/024177
PCT Pub. Date: Mar. 2, 2023

(65) Prior Publication Data
US 2023/0066317 A1    Mar. 2, 2023

(30) Foreign Application Priority Data
Aug. 24, 2021   (CN) .......................... 202110971754.1

(51) Int. Cl.
*H05K 5/02*   (2006.01)
(52) U.S. Cl.
CPC ................................. *H05K 5/0217* (2013.01)

(58) Field of Classification Search
CPC ........................................................ H05K 7/00
See application file for complete search history.

(56) References Cited

U.S. PATENT DOCUMENTS 7,821,479 B2 * 10/2010 Zhang ..................... G09F 9/301
345/82
9,655,267 B2 * 5/2017 Cope ......................... G09F 9/35
(Continued)

FOREIGN PATENT DOCUMENTS

| CN | 103094307 A | 5/2013 |
| CN | 104851373 A | 8/2015 |

(Continued)

OTHER PUBLICATIONS

International Search Report in International application No. PCT/CN2021/117925, dated Apr. 25, 2022.
(Continued)

*Primary Examiner* — Jerry Wu
(74) *Attorney, Agent, or Firm* — PV IP PC; Wei Te Chung; Zhigang Ma

(57) ABSTRACT

A display device and a display method are provided. The display device includes a display mechanism and a motion mechanism. The display mechanism includes a plurality of first display groups, a plurality of second display groups, and a plurality of third display groups arranged along a first direction. The motion mechanism is respectively connected to the first display groups, the second display groups, and the third display groups, and is configured to guide the first display groups, the second display groups, the third display groups to move along the first direction.

15 Claims, 7 Drawing Sheets

(56) References Cited

U.S. PATENT DOCUMENTS

2013/0113843 A1    5/2013   Yamazaki
2015/0069904 A1    3/2015   Suzuki

FOREIGN PATENT DOCUMENTS

| | | |
|---|---|---|
| CN | 105575309 A | 5/2016 |
| CN | 105723444 A | 6/2016 |
| CN | 106097896 A | 11/2016 |
| CN | 205959554 U | 2/2017 |
| CN | 111161643 A | 5/2020 |
| CN | 111383544 A | 7/2020 |
| CN | 111599284 A | 8/2020 |
| CN | 111968524 A | 11/2020 |
| CN | 112002225 A | 11/2020 |
| CN | 212135822 U | 12/2020 |
| CN | 113178537 A | 7/2021 |
| JP | 2009283676 A | 12/2009 |
| JP | 2019124740 A | 7/2019 |
| TW | 201032198 A | 9/2010 |

OTHER PUBLICATIONS

Written Opinion of the International Searching Authority in International application No. PCT/CN2021/117925, dated Apr. 25, 2022.
Chinese Office Action issued in corresponding Chinese Patent Application No. 202110971754.1 dated Apr. 2, 2022, pp. 1-10.

\* cited by examiner

DISPLAY DEVICE AND DISPLAY METHOD

CROSS REFERENCE TO RELATED APPLICATIONS

This application is a National Phase of PCT Patent Application No. PCT/CN2021/117925 having international filing date of Sep. 13, 2021, which claims priority of Chinese patent Application No. 202110971754.1 filed on Aug. 24, 2021 with the National Intellectual Property Administration, titled "DISPLAY DEVICE AND DISPLAY METHOD", which is incorporated by reference in the present application in its entirety.

BACKGROUND OF INVENTION

Field of Invention

The present application relates to a field of display technology, and particularly to a display device and a display method.

Description of Prior Art

With development of display technology, display of ordinary screens can no longer meet requirements from the market. Therefore, a solution of extending display of screens appears. Foldable screens are an important solution of extending display of the screens, which relies on folding and unfolding the screens to achieve contraction and extension of display regions. Therefore, their novelty and sense of technology are favored by users. However, the foldable screens have superimposed regions of two layers of screens in a folded state, causing a screen thickness in the folded state to be large, which affects user experience.

There is a technical problem of a large thickness in current display solutions of foldable screens in a folded state.

SUMMARY OF INVENTION

The present application provides a display device and a display method, which are used to relieve the technical problem of the large thickness in current display solutions of the foldable screens in the folded state.

The present application provides a display device, including: a display mechanism and a motion mechanism;
wherein the display mechanism includes a plurality of first display groups, a plurality of second display groups, and a plurality of third display groups arranged along a first direction,
the motion mechanism is connected to the first display groups, the motion mechanism is configured to guide the first display groups to move along the first direction,
the motion mechanism is connected to the second display groups, the motion mechanism is configured to guide the second display groups to move along the first direction,
the motion mechanism is connected to the third display groups, and the motion mechanism is configured to guide the third display groups to move along the first direction.

In the display device of the present application, the display device includes a middle display region and an extension display region;
the display device has a first display mode and a second display mode;
in the first display mode, the first display groups, the second display groups, and the third display groups are located in the middle display region; and
in the second display mode, a part of the first display groups and a part of the second display groups, and a part of the third display groups are located in the extension display region.

In the display device of the present application, the extension display region is located on a side of the middle display region.

In the display device of the present application, the extension display region includes two sections located on two opposite sides of the middle display region.

In the display device of the present application, the motion mechanism includes skid rails extended along the first direction, and the skid rails cross the middle display region and the extension display region.

In the display device of the present application, the first display groups are movably connected to the skid rails; the second display groups are movably connected to the skid rails; and the third display groups are movably connected to the skid rails.

In the display device of the present application, the skid rails include magnetic wheel respectively connected to the first display groups, the second display groups, and the third display groups, and magnetic rails movably connected to the magnetic wheels.

In the display device of the present application, the display device further includes a control mechanism, and the magnetic wheels and the magnetic rails are respectively electrically connected to the control mechanism.

In the display device of the present application, the first display groups, the second display groups, and the third display groups are sequentially arranged along the first direction; and
the motion mechanism further includes first telescopic elements disposed between the first display groups and the second display groups, second telescopic elements disposed between the second display groups and the third display groups, and third telescopic elements disposed between the third display groups and the first display groups;

In the display device of the present application, the motion mechanism includes motion rails, and the first telescopic elements, the second telescopic elements, and the third telescopic elements guide the first display groups, the second display groups, and the third display groups to move along the motion rails.

In the display device of the present application, the first display groups include a plurality of first light-emitting elements arranged along a second direction, the second display groups include a plurality of second light-emitting elements arranged along the second direction, and the third display groups include a plurality of third light-emitting elements arranged along the second direction.

In the display device of the present application, the first light-emitting elements include red diodes, the second light-emitting elements include green diodes, and the third light-emitting elements include blue diodes.

In the display device of the present application, the plurality of first light-emitting elements located in one same first display group emit light independently; the plurality of second light-emitting elements located in one same second display group emit light independently; and the plurality of third light-emitting elements located in one same third display group emit light independently.

In the display device of the present application, the display device further includes a control mechanism, and the control mechanism is configured to control the motion mechanism to move.

In the display device of the present application, one of the second display groups and one of the third display groups are arranged between every two adjacent first display groups.

The present application further provides a display method, which us applied in the display device. The display device includes a display mechanism and a motion mechanism. The display mechanism includes a plurality of first display groups, a plurality of second display groups, and a plurality of third display groups arranged along a first direction, and the display device includes a middle display region and an extension display region. The display method includes:

obtaining a display extension instruction; and controlling the motion mechanism to guide the first display groups, the second display groups, and the third display groups to extend to the extension display region according to the display extension instruction.

In the display method of the present application, the display method further includes:

obtaining a display contraction instruction; and controlling the motion mechanism to guide the first display groups, the second display groups, and the third display groups to contract to the middle display region according to the display contraction instruction.

In the display method of the present application, the motion mechanism includes skid rails extended along the first direction, and the skid rails include magnetic wheel respectively connected to the first display groups, the second display groups, and the third display groups, and magnetic rails movably connected to the magnetic wheels; the step of controlling the motion mechanism to guide the first display groups, the second display groups, and the third display groups to extend to the extension display region according to the display extension instruction includes:

controlling the magnetic wheels and the magnetic rails of the motion mechanism to generate magnetic fields respectively according to the display extension instruction, wherein under interaction between the magnetic fields of the magnetic wheels and the magnetic rails, the magnetic wheels guide the first display groups, the second display groups, and the third display groups to move to the extension display region.

In the display method of the present application, the motion mechanism includes first telescopic elements disposed between the first display groups and the second display groups, second telescopic elements disposed between the second display groups and the third display groups, and third telescopic elements disposed between the third display groups and the first display groups; the step of controlling the motion mechanism to guide the first display groups, the second display groups, and the third display groups to extend to the extension display region according to the display extension instruction includes:

controlling the first telescopic elements, the second telescopic elements, and the third telescopic elements of the motion mechanism to extend to drive the first display groups, the second display groups, and the third display groups to move to the extension display region according to the display extension instruction.

The present application further provides a display device, including a display mechanism and a motion mechanism; the display mechanism includes a plurality of first display groups, a plurality of second display groups, and a plurality of third display groups arranged along a first direction, the motion mechanism comprises magnetic wheel respectively connected to the first display groups, the second display groups, and the third display groups, and magnetic rails movably connected to the magnetic wheels; and the first display groups, the second display groups, and the third display groups are guided by the magnetic wheels to move along the motion rails.

The present application provides a display device and a display method. The display device includes a display mechanism and a motion mechanism. The display mechanism includes a plurality of first display groups, a plurality of second display groups, and a plurality of third display groups arranged along a first direction, and The motion mechanism is respectively connected to the first display groups, the second display groups, and the third display groups, and is configured to guide the first display groups, the second display groups, the third display groups to move along the first direction. In the present application, by disposing the motion mechanism in the display device, and by configuring the motion mechanism to be able to guide each of the display groups in the display mechanism to move, extension and contraction of the display region is realized, and there is no superimposed region of the screen when the display region of the display device is contracted, thereby avoiding increment of a thickness of the display device.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which those skilled in the art can derive further without making any inventive efforts.

DETAILED DESCRIPTION OF PREFERRED EMBODIMENTS

Figure 1:
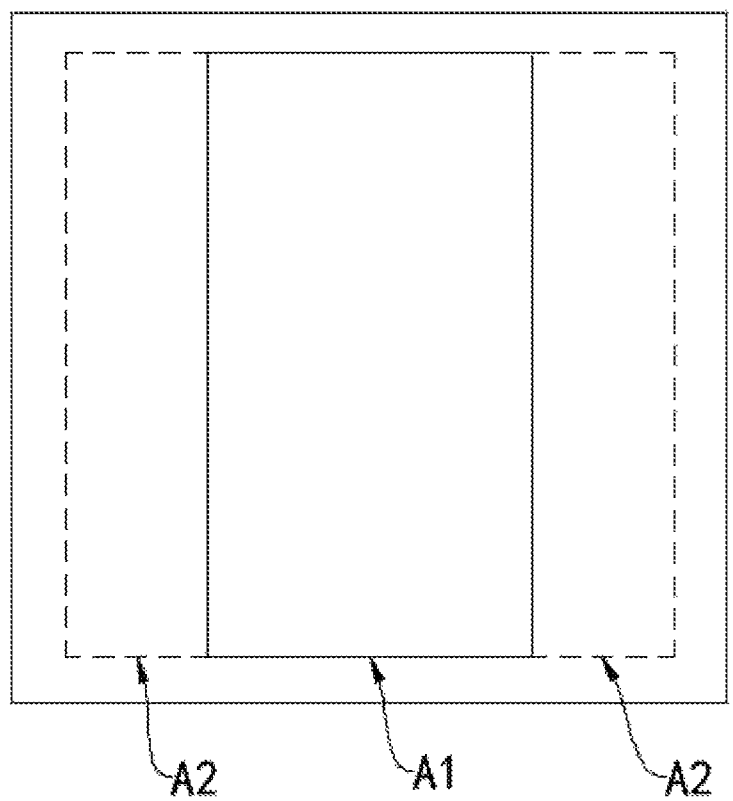
FIG. 1 is a structural schematic diagram of a display device provided by one embodiment of the present application.

The descriptions of embodiments below refer to accompanying drawings in order to illustrate certain embodiments which the present application can implement. The directional terms of which the present application mentions, for example, "top," "bottom," "upper," "lower," "front," "rear," "left," "right," "inside," "outside," "side," etc., are just refer to directions of the accompanying figures. Therefore, the used directional terms are for illustrating and understanding the present application, but not for limiting the present application. In the figures, units with similar structures are indicated by the same reference numerals.

Embodiments the present application provide a display device and a display method. The display device includes a display mechanism and a motion mechanism. The display mechanism includes a plurality of first display groups, a plurality of second display groups, and a plurality of third display groups arranged along a first direction, and The motion mechanism is respectively connected to the first display groups, the second display groups, and the third display groups, and is configured to be able to guide the first display groups, the second display groups, the third display groups to move along the first direction. In the embodiments of the present application, by disposing the motion mechanism in the display device, and by configuring the motion mechanism to be able to guide each of the display groups in the display mechanism to move, extension of the display region is realized, and there is no superimposed region of the screen when the display device has a relative small display region, thereby avoiding increment of a thickness.

The display device provided by the present application is described in detail below in combined with specific embodiments.

Figure 2:
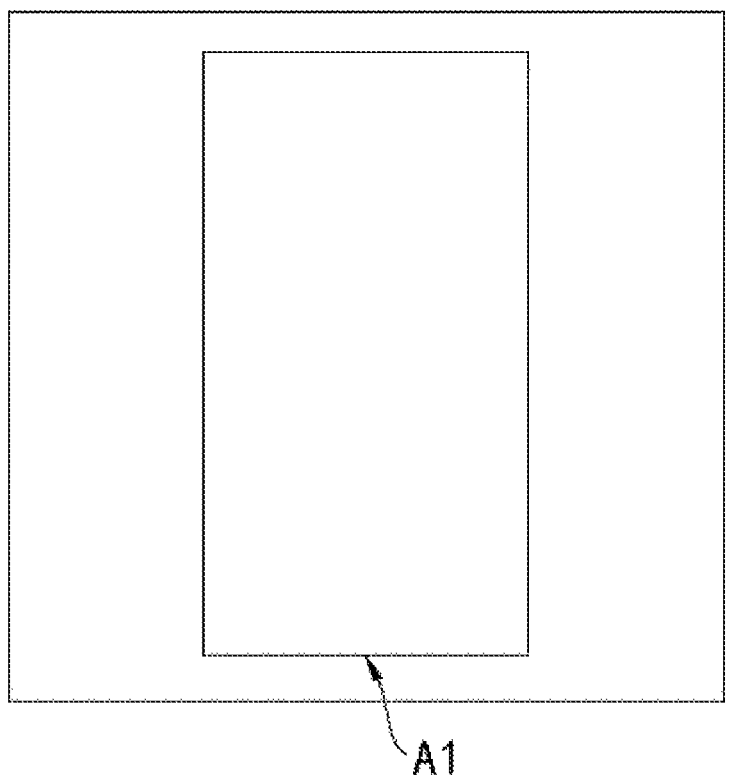
FIG. 2 is a schematic diagram of a display region of the display device provided by one embodiment of the present application in a contraction state.
Figure 3:
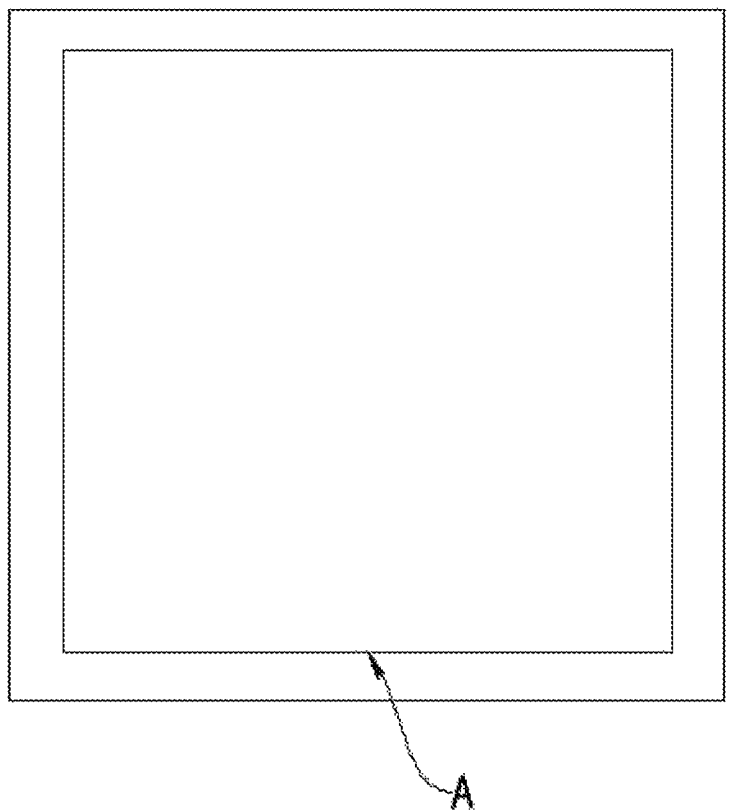
FIG. 3 is a schematic diagram of the display region of the display device provided by one embodiment of the present application in an extension state.

Please refer to FIG. 1 to FIG. 3. FIG. 1 is a structural schematic diagram of a display device provided by one embodiment of the present application. FIG. 2 is a schematic diagram of a display region of the display device provided by one embodiment of the present application in a contraction state. FIG. 3 is a schematic diagram of the display region of the display device provided by one embodiment of the present application in an extension state.

The display device includes a middle display region A1 and an extension display region A2 defined side by side and along a first direction with the middle display region A1. Wherein, the first direction refers to a direction from the middle display region A1 to the extension display region A2.

The display device has a first display mode and a second display mode. The first display mode corresponds to a display mode that the display device is in a complete contraction state. The second display mode corresponds to a display mode that the display device is in an extension state. In the complete contraction state, the display region of the display device concentrates in the middle display region A1, i.e., only the middle display region A1 serves a display function, and the extension display region A2 does not serve the display function. In the extension state, the middle display region A1 and at least part of the extension display region A2 of the display device serve the display function, thereby realizing extension of the display region and performing a larger display screen.

Optionally, the extension display region A2 is located on a side of the middle display region A1. When the display device is changed from the contraction state to the extension state, the display region of the display device extend from the middle display region A1 to the extension display region A2 of one side of the display device. When the display device is in a complete extension state, the display region of the display device covers all the middle display region A1 and all the extension display region A2.

Optionally, the extension display region A2 includes two sections located on two opposite sides of the middle display region A1. When the display device is changed from the contraction state to the extension state, the display region of the display device extend from the middle display region A1 to the extension display region A2 of two sides of the display device. When the display device is in the complete extension state, the display region of the display device covers all the middle display region A1 and all the extension display region A2.

Figure 4:
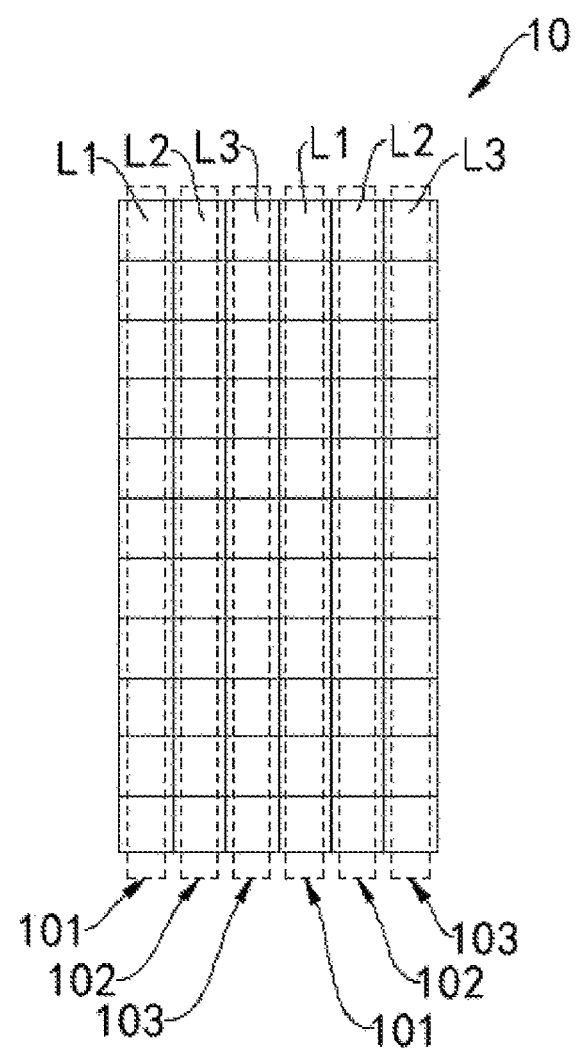
FIG. 4 is a schematic diagram of a display mechanism of the display device provided by one embodiment of the present application in a contraction state.
Figure 5:
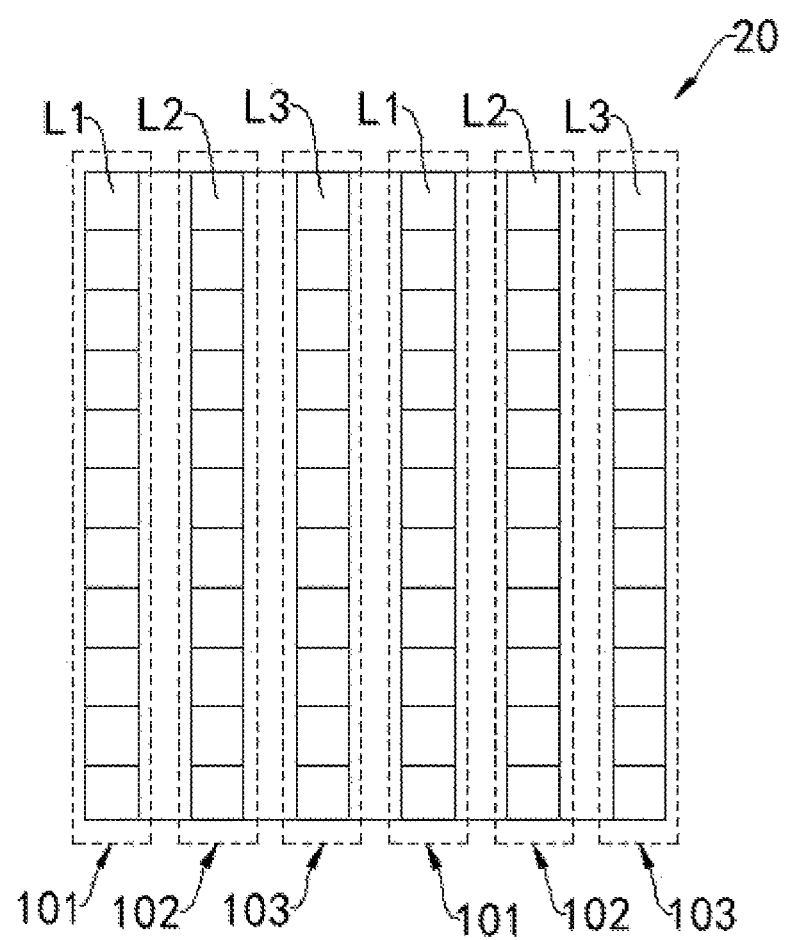
FIG. 5 is a schematic diagram of the display mechanism of the display device provided by one embodiment of the present application in an extension state.

Please further refer to FIG. 4 and FIG. 5. FIG. 4 is a schematic diagram of a display mechanism of the display device provided by one embodiment of the present application in a contraction state. FIG. 5 is a schematic diagram of the display mechanism of the display device provided by one embodiment of the present application in an extension state.

The display device 10 includes a control mechanism 10. The display mechanism 10 includes a plurality of first display groups 101, a plurality of second display groups 102, and a plurality of third display groups 103 arranged along a first direction. The first display groups 101, the second display groups 102, and the third display groups 103 are sequentially arranged along the first direction, and one of the second display groups 103 and one of the third display groups 102 are arranged between every two adjacent first display groups 101.

The first display groups 101 include a plurality of first light-emitting elements L1 arranged along a second direction. The second display groups 102 include a plurality of second light-emitting elements L2 arranged along the second direction. The third display groups 103 include a plurality of third light-emitting elements L3 arranged along the second direction. The first direction and the second direction can be two directions which are perpendicular to each other. The plurality of first light-emitting elements L1 located in one same first display group 101 emit light simultaneously or can also emit light independently. Each of the first light-emitting elements L1 is controlled by an independent light-emitting control unit. The plurality of second light-emitting elements L2 located in one same second display group 102 can emit light simultaneously or can also emit light independently. Each of the second light-emitting elements L2 is controlled by the independent light-emitting control unit. The plurality of third light-emitting elements L3 located in one same third display group 103 emit light simultaneously or can also emit light independently. Each of the third light-emitting elements L3 is controlled by the independent light-emitting control unit.

Optionally, the first light-emitting elements L2 include red diodes, the second light-emitting elements L2 include green diodes, and the third light-emitting elements L3 include blue diodes. Wherein, the red diodes, the green diodes, and the blue diodes can all be micro light-emitting diodes. When the display mechanism 10 is manufactured, the mass transfer technology for the micro light-emitting diodes can be used to complete manufacturing of the first display groups 101, the second display groups 102, and the third display groups 103. In the first display mode, i.e., when the display device is in the complete contraction state, the first display groups 101, the second display groups 102, and the third display groups 103 are all located in the middle display region A1, and distances between the first display groups 101, the second display groups 102, and the third display groups 103 are the smallest. At this time, a display area of the display device is the smallest, but a pixel density in the display area is the highest, and a resolution of a display screen is the highest.

In the second display mode, i.e., when the display device is in an extension display state, the first display groups 101, the distances between the first display groups 101, the second display groups 102, and the third display groups 103 are enlarged. Therefore, a part of the first display groups 101, a part of the second display groups 102, and a part of the third display group 103 are allowed to enter the extension display region A2. At this time, the display area of the display device is increased, which realizes the extension of the display screen. Meanwhile, the pixel density in the display area is reduced, and the resolution of the display screen is also reduced.

In this embodiment, by controlling motion of each display group in the display mechanism, the extension and contraction of the display area is realized. Unlike a solution that the display region changed through folding and unfolding of a screen realized in the foldable display device, this embodiment can prevent increment of thickness of the display device.

Figure 6:
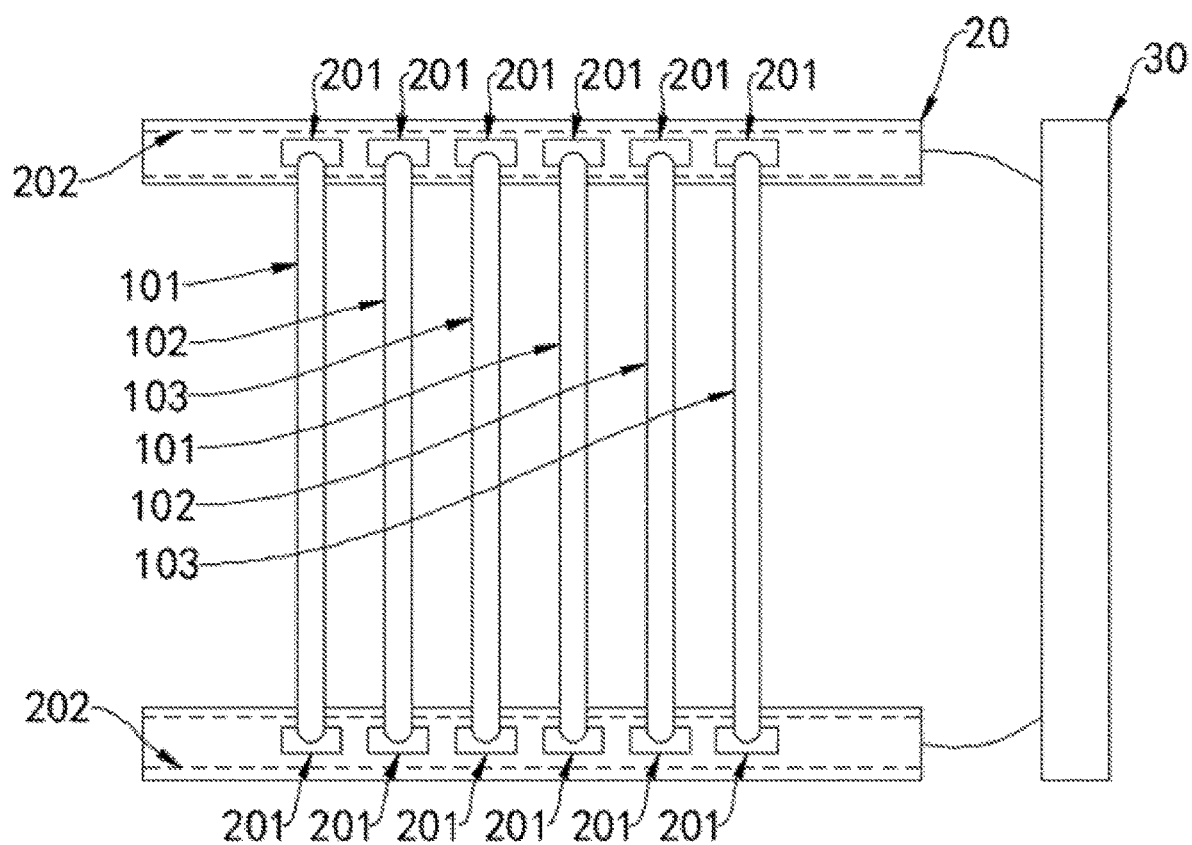
FIG. 6 is a first principle diagram of the display device provided by one embodiment of the present application.

Please refer to FIG. 1 to FIG. 6. FIG. 6 is a first principle diagram of the display device provided by one embodiment of the present application.

In this embodiment, the display device further includes a motion mechanism 20 connected to the display mechanism 10 and the control mechanism 30 configured to control the motion mechanism 20 to move. Wherein, the motion mechanism 20 is connected to the first display groups 101 and is configured to guide the first display groups 101 to move along the first direction; the motion mechanism 20 is connected to the second display groups 102 and is configured to guide the second display groups 102 to move along the first direction; and the motion mechanism 20 is connected to the third display groups 103 and is configured to guide the third display groups 103 to move along the first direction. By guiding the first display groups 101, the second display groups 102, and the third display groups 103 to move by the motion mechanism 20, extension and contraction of the display region are realized.

Specifically, the motion mechanism 20 includes skid rails extended along the first direction. The skid rails cross the middle display region A1 and the extension display region A2. The first display groups 101, the second display groups 102, and the third display groups 103 can slide along the skid rails.

The skid rails include magnetic wheel 201 respectively connected to the first display groups 101, the second display groups 102, and the third display groups 103, and magnetic rails 202 movably connected to the magnetic wheels 201. The magnetic wheels 201 and the magnetic rails 202 are respectively electrically connected to the control mechanism 30. Under control of the control mechanism 30, the magnetic rail 202 and the magnetic wheel 201 respectively generate magnetic fields with specific intensities and specific directions. Under interaction between the magnetic fields of the magnetic wheels 201 and the magnetic rails 202, the magnetic wheels 201 guide the first display groups 101, the second display groups 102, and the third display groups 103 to move to realize extension and contraction of the display region.

Optionally, the magnetic wheel 201 and the magnetic rail 202 can be respectively disposed on two opposite sides of the display mechanism 10, thereby simultaneously guiding the display mechanism 10 to move from the two sides.

Wherein, the control mechanism 30 controls the motion mechanism 20 to move by receiving a display extension instruction or a display contraction instruction. The display extension instruction and the display contraction instruction can be instructions inputted to the display device through an input device, or can be the instructions generated from the display device itself by calculating size parameters, resolution parameters, and other data of a screen to be displayed.

Figure 7:
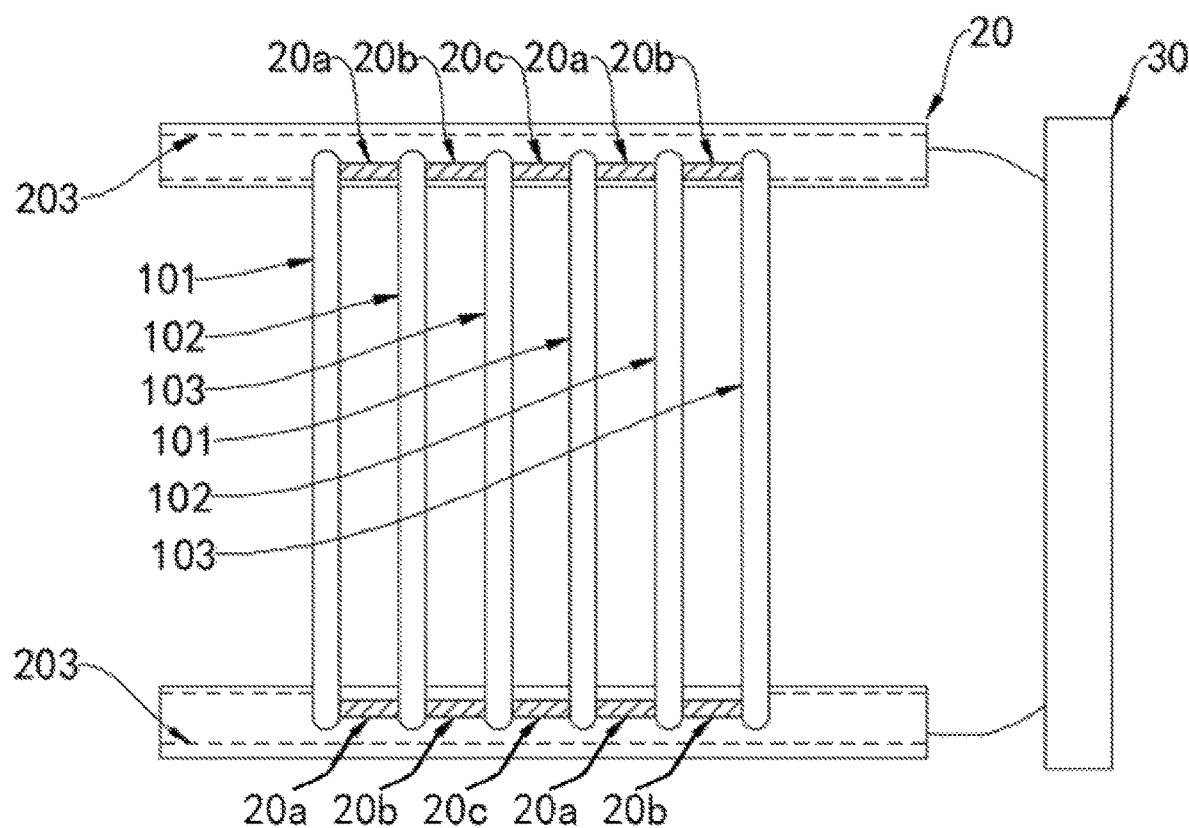
FIG. 7 is a second principle diagram of the display device provided by one embodiment of the present application.

Please refer to FIG. 1 to FIG. 5, and FIG. 7. FIG. 7 is a second principle diagram of the display device provided by one embodiment of the present application.

In this embodiment, the display device further includes a motion mechanism 20 connected to the display mechanism 10 and the control mechanism 30 configured to control the motion mechanism 20 to move. The motion mechanism 20 is connected to the first display groups 101 and is configured to guide the first display groups 101 to move along the first direction; the motion mechanism 20 is connected to the second display groups 102 and is configured to guide the second display groups 102 to move along the first direction; and the motion mechanism 20 is connected to the third display groups 103 and is configured to guide the third display groups 103 to move along the first direction. By guiding the first display groups 101, the second display groups 102, and the third display groups 103 to move by the motion mechanism 20, extension and contraction of the display region are realized.

Wherein, the first display groups 101, the second display groups 102, and the third display groups 103 are sequentially arranged along the first direction. The motion mechanism 20 includes first telescopic elements 20a disposed between the first display groups 101 and the second display groups 102, second telescopic elements 20b disposed between the second display groups 102 and the third display groups 103, and third telescopic elements 20c disposed between the third display groups 103 and the first display groups 101.

The first telescopic elements 20a, the second telescopic elements 20b, and the third telescopic elements 20c can be a same type of telescopic elements, or can be different types of telescopic elements.

The motion mechanism 20 further includes motion rails 203. When the first telescopic elements 20a, the second telescopic elements 20b, and the third telescopic elements 20c are performed in extension and contraction motions, the first display groups 101, the second display groups 102, and the third display groups 103 are pushed by the telescopic elements to move along the motion rails 203, thereby realizing extension and contraction of the display region.

Optionally, the first telescopic elements 20a, the second telescopic elements 20b, and the third telescopic elements 20c can be respectively disposed on two opposite sides of the display mechanism 10, thereby simultaneously guiding the display mechanism 10 to move from the two sides.

The control mechanism 30 controls the motion mechanism 20 to move by receiving a display extension instruction or a display contraction instruction. The display extension instruction and the display contraction instruction can be instructions inputted to the display device through input equipment, or can be the instructions generated from the display device itself by calculating size parameters, resolution parameters, and other data of a screen to be displayed.

In summary, the display device provided by the embodiments of the present application includes the display mechanism and the motion mechanism. The display mechanism includes the plurality of first display groups, the plurality of second display groups, and the plurality of third display groups arranged along the first direction. The motion mechanism is respectively connected to the first display groups, the second display groups, and the third display groups. The motion mechanism is configured to guide the first display groups, the second display groups, the third display groups to move along the first direction. In the embodiments of the present application, by disposing the motion mechanism in the display device, and by configuring the motion mechanism to be able to guide each of the display groups in the display mechanism to move, extension and contraction of the display region is realized, and there is no superimposed region of the screen when the display device has a relative small display region, thereby avoiding increment of thickness.

Embodiments of the present application further provides a display method. The display method is applied in a display device. The display device is the display device provided by the aforesaid embodiments of the present application.

Please refer to FIG. 1 to FIG. 7. The display device includes a display mechanism 10 and a motion mechanism 20. The display mechanism 10 includes a plurality of first display groups 101, a plurality of second display groups 102, and a plurality of third display groups 103 arranged along a first direction. The display device includes a middle display region A1 and an extension display region A2.

The first display groups 101 include a plurality of first light-emitting elements L1 arranged along a second direction. The second display groups 102 include a plurality of second light-emitting elements L2 arranged along the second direction. The third display groups 103 include a plurality of third light-emitting elements L3 arranged along the second direction. The first direction and the second direction can be two directions which are perpendicular to each other. The plurality of first light-emitting elements L1 located in one same first display group 101 can emit light independently. The plurality of second light-emitting elements L2 located in one same second display group 102 can emit light independently. The plurality of third light-emitting elements L3 located in one same third display group 103 can emit light independently.

The motion mechanism 20 is respectively connected to the first display groups 101, the second display groups 102, and the third display groups 103, and is configured to guide the first display groups 101, the second display groups 102, the third display groups 103 to move along the first direction.

Optionally, the motion mechanism 20 can refer to FIG. 6. The motion mechanism 20 includes magnetic wheels 201 respectively connected to the first display groups 101, the second display groups 102, and the third display groups 103, and magnetic rails 202 movably connected to the magnetic wheels 201. Under interaction between the magnetic fields of the magnetic wheels 201 and the magnetic rails 202, the magnetic wheels 201 guide the first display groups 101, the second display groups 102, and the third display groups 103 to move.

Optionally, the motion mechanism 20 can further refer to FIG. 7. The motion mechanism 20 includes first telescopic elements 20a disposed between the first display groups 101 and the second display groups 102, second telescopic elements 20b disposed between the second display groups 102 and the third display groups 103, third telescopic elements 20c disposed between the third display groups 103 and the first display groups 101, and motion rails 203. When the first telescopic elements 20a, the second telescopic elements 20b, and the third telescopic elements 20c are performed in extension and contraction motions, the first display groups 101, the second display groups 102, and the third display groups 103 are pushed by the telescopic elements to move along the motion rails 203.

On the basis of the aforesaid display device, the display method provided by one embodiment of the present application includes following steps.

Step 101: obtaining a display extension instruction.

The display extension instruction can be an instruction inputted to the display device through input equipment, or can be the instructions generated from the display device itself by calculating size parameters, resolution parameters, and other data of a screen to be displayed. The display extension instruction can include a range of a size of extension of the display region, for example, an extension region completely covers the extension display region A2, or partially covers the extension display region A2.

Step 102: controlling the motion mechanism 20 to guide the first display groups 101, the second display groups 102, and the third display groups 103 to extend to the extension display region A2 according to the display extension instruction.

Optionally, the magnetic wheels 201 and the magnetic rails 202 of the motion mechanism 20 are controlled to generate magnetic fields respectively according to the display extension instruction. Under interaction between the magnetic fields of the magnetic wheels 201 and the magnetic rails 202, the magnetic wheels 201 guide the first display groups 101, the second display groups 102, and the third display groups 103 to move to the extension display region A2 to realize extension of the display region.

Optionally, the first telescopic elements 20a, the second telescopic elements 20b, and the third telescopic elements 20c of the motion mechanism 20 are controlled to extend to drive the first display groups 101, the second display groups 102, and the third display groups 103 to move to the extension display region A2 along the motion rails 203 according to the display extension instruction, thereby realizing extension of the display region.

Furthermore, the display method provided by this embodiment further includes following step: obtaining a display contraction instruction; and controlling the motion mechanism 20 to guide the first display groups 101, the second display groups 102, and the third display groups 103 to contract to the middle display region A1 according to the display contraction instruction.

Specifically, the display contraction instruction can be an instruction inputted to the display device through input equipment, or can be the instructions generated from the display device itself by calculating size parameters, resolution parameters, and other data of a screen to be displayed. The display contraction instruction can include a range of a size of contraction of the display region, for example, the display region is completely contracted to the middle display region A1.

The magnetic wheels 201 and the magnetic rails 202 of the motion mechanism 20 are controlled to generate magnetic fields respectively according to the display contraction instruction. Under interaction between the magnetic fields of the magnetic wheels 201 and the magnetic rails 202, the magnetic wheels 201 guide the first display groups 101, the second display groups 102, and the third display groups 103 to move to the middle display region A1 to realize contraction of the display region.

Or, the first telescopic elements 20a, the second telescopic elements 20b, and the third telescopic elements 20c of the motion mechanism 20 are controlled to contract to drive the first display groups 101, the second display groups 102, and the third display groups 103 to move to the middle display region A1 along the motion rails 203 according to the display contraction instruction, thereby realizing contraction of the display region.

In summary, the display method provided by this embodiment realizes the extension and contraction of the display region by controlling the motion mechanism to drive each display group of the display mechanism to move in a specific direction. The display method is different from a method of changing the display region by folding and unfolding a screen. This embodiment can avoid increment of thickness of the display device when the display region is contracted. It should be noted that although the present application has disclosed the specific embodiments as above, the above-mentioned embodiments are not to limit to the present application. A person skilled in the art can make any change and modification; therefore, the scope of protection of the present application is subject to the scope defined by the claims.

What is claimed is:

1. A display device, comprising: a display mechanism and a motion mechanism; wherein the display mechanism comprises a plurality of first display groups, a plurality of second display groups, and a plurality of third display groups arranged along a first direction, the motion mechanism is connected to the first display groups, the motion mechanism is configured to guide the first display groups to move along the first direction, the motion mechanism is connected to the second display groups, the motion mechanism is configured to guide the second display groups to move along the first direction, the motion mechanism is connected to the third display groups, and the motion mechanism is configured to guide the third display groups to move along the first direction; and the display device comprises a middle display region and an extension display region located on an opposite side of the middle display region; the display device has a first and a second display modes; in the first display mode, the first, second, and third display groups are located in the middle display region; and in the second display mode, a part of the first display groups, a part of the second display groups, and a part of the third display groups are located in the extension display region; and the motion mechanism comprises skid rails extended along the first direction, and the skid rails cross the middle display region and the extension display region; and the skid rails comprise magnetic wheels respectively connected to the first, second, and third display groups, and magnetic rails movably connected to the magnetic wheels.

2. The display device as claimed in claim 1, wherein the extension display region is located on a side of the middle display region.

3. The display device as claimed in claim 1, wherein the extension display region comprises two sections located on two opposite sides of the middle display region.

4. The display device as claimed in claim 1, wherein the display device comprises a control mechanism, and the magnetic wheels and the magnetic rails are respectively electrically connected to the control mechanism.

5. The display device as claimed in claim 1, wherein the first display groups, the second display groups, and the third display groups are sequentially arranged along the first direction; and
    the motion mechanism comprises first telescopic elements disposed between the first display groups and the second display groups, second telescopic elements disposed between the second display groups and the third display groups, and third telescopic elements disposed between the third display groups and the first display groups.

6. The display device as claimed in claim 5, wherein the motion mechanism comprises motion rails, and the first telescopic elements, the second telescopic elements, and the third telescopic elements guide the first display groups, the second display groups, and the third display groups to move along the motion rails.

7. The display device as claimed in claim 1, wherein the first display groups comprise a plurality of first light-emitting elements arranged along a second direction, the second display groups comprise a plurality of second light-emitting elements arranged along the second direction, and
    the third display groups comprise a plurality of third light-emitting elements arranged along the second direction.

8. The display device as claimed in claim 7, wherein the first light-emitting elements comprise red diodes, the second light-emitting elements comprise green diodes, and the third light-emitting elements comprise blue diodes.

9. The display device as claimed in claim 1, wherein the plurality of first light-emitting elements located in one same first display group emit light independently; the plurality of second light-emitting elements located in one same second display group emit light independently; and the plurality of third light-emitting elements located in one same third display group emit light independently.

10. The display device as claimed in claim 1, wherein the display device comprises a control mechanism, and the control mechanism is configured to control the motion mechanism to move.

11. The display device as claimed in claim 1, wherein one of the second display groups and one of the third display groups are arranged between every two adjacent first display groups.

12. A display method, applied in a display device, wherein the display device comprises a display mechanism and a motion mechanism, the display mechanism comprises a plurality of first display groups, a plurality of second display groups, and a plurality of third display groups arranged along a first direction, and the display device comprises a middle display region and an extension display region located on an opposite side of the middle display region; the display method comprises: obtaining a display extension instruction; and controlling the motion mechanism to guide the first display groups, the second display groups, and the third display groups to extend to the extension display region according to the display extension instruction; and the motion mechanism comprises skid rails extended along the first direction, and the skid rails comprise magnetic wheel respectively connected to the first display groups, the second display groups, and the third display groups, and magnetic rails movably connected to the magnetic wheels; the step of controlling the motion mechanism to guide the first display groups, the second display groups, and the third display groups to extend to the extension display region according to the display extension instruction comprises: controlling the magnetic wheels and the magnetic rails of the motion mechanism to generate magnetic fields respectively according to the display extension instruction, wherein under interaction between the magnetic fields of the magnetic wheels and the magnetic rails, the magnetic wheels guide the first display groups, the second display groups, and the third display groups to move to the extension display region.

13. The display method as claimed in claim 12, wherein the display method comprises:
    obtaining a display contraction instruction; and
    controlling the motion mechanism to guide the first display groups, the second display groups, and the third display groups to contract to the middle display region according to the display contraction instruction.

14. The display method as claimed in claim 13, wherein the motion mechanism comprises first telescopic elements disposed between the first display groups and the second display groups, second telescopic elements disposed between the second display groups and the third display groups, and third telescopic elements disposed between the third display groups and the first display groups; the step of controlling the motion mechanism to guide the first display groups, the second display groups, and the third display groups to extend to the extension display region according to the display extension instruction comprises:

controlling the first telescopic elements, the second telescopic elements, and the third telescopic elements of the motion mechanism to extend to drive the first display groups, the second display groups, and the third display groups to move to the extension display region according to the display extension instruction.

15. A display device, comprising: a display mechanism and a motion mechanism; wherein the display mechanism comprises a plurality of first display groups, a plurality of second display groups, and a plurality of third display groups arranged along a first direction, the motion mechanism comprises magnetic wheel respectively connected to the first display groups, the second display groups, and the third display groups, and magnetic rails movably connected to the magnetic wheels; and the first display groups, the second display groups, and the third display groups are guided by the magnetic wheels to move along the motion rails; and the display device comprises a middle display region and an extension display region located on an opposite side of the middle display region; the display device has a first and a second display modes; in the first display mode, the first, second, and third display groups are located in the middle display region; and in the second display mode, a part of the first display groups, a part of the second display groups, and a part of the third display groups are located in the extension display region.

\* \* \* \* \*